(12) United States Patent
Koo et al.

(10) Patent No.: US 8,587,044 B2
(45) Date of Patent: Nov. 19, 2013

(54) COMPLEMENTARY LOGIC DEVICE USING SPIN INJECTION

(71) Applicant: Korea Institute of Science and Technology, Seoul (KR)

(72) Inventors: Hyun Cheol Koo, Seoul (KR); Hyung Jun Kim, Seoul (KR); Joon Yeon Chang, Seoul (KR); Suk Hee Han, Seoul (KR); Hi Jung Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 13/667,380

(22) Filed: Nov. 2, 2012

(65) Prior Publication Data

US 2013/0140606 A1  Jun. 6, 2013

(30) Foreign Application Priority Data

Dec. 6, 2011  (KR) .......................... 10-2011-0129651

(51) Int. Cl.
*H01L 21/02*  (2006.01)
(52) U.S. Cl.
USPC .................................. 257/295; 257/E29.323
(58) Field of Classification Search
USPC .......................................... 257/295, E29.323
See application file for complete search history.

(56) References Cited

U.S. PATENT DOCUMENTS

| | | | |
|---|---|---|---|
| 7,212,433 B2 * | 5/2007 | Johnson | 365/158 |
| 7,961,493 B2 * | 6/2011 | Karg et al. | 365/145 |
| 2011/0233524 A1 * | 9/2011 | Wang et al. | 257/39 |
| 2011/0279146 A1 * | 11/2011 | Koo et al. | 326/100 |

FOREIGN PATENT DOCUMENTS

KR  101084019 B1  11/2011

* cited by examiner

*Primary Examiner* — Trung Q Dang
(74) *Attorney, Agent, or Firm* — Ladas & Parry LLP

(57) ABSTRACT

A complementary logic device includes: an insulating layer formed on a substrate; a source electrode formed of a ferromagnetic body on the insulating layer; a gate insulating film; a gate electrode formed on the gate insulating film and controlling a magnetization direction of the source electrode; a channel layer formed on each of a first side surface and a second side surface of the source electrode and transmitting spin-polarized electrons from the source electrode; a first drain electrode formed on the first side surface of the source electrode; and a second drain electrode formed on the second side surface of the source electrode, wherein a magnetization direction of the first drain electrode and a magnetization direction of the second drain electrode are antiparallel to each other. Therefore, not only characteristics of low power and high speed but also characteristics of non-volatility and multiple switching by spin may be obtained.

13 Claims, 4 Drawing Sheets

COMPLEMENTARY LOGIC DEVICE USING SPIN INJECTION

CROSS-REFERENCE TO RELATED APPLICATION

This application claims priority to Korean Patent Application No. 10-2011-0129651, filed on Dec. 6, 2011, and all the benefits accruing therefrom under 35 U.S.C. §119, the contents of which in its entirety are herein incorporated by reference.

BACKGROUND

1. Field

The present disclosure relates to a complementary logic device using spin injection, and more particularly, to a complementary logic device using spin injection capable of controlling two transistors with a single gate electrode.

2. Description of the Related Art

Logic and switching devices based on semiconductors are most important in integrated circuits which perform and process complex functions, are in high value-added fields, and thus have been researched by various research groups and corporations. Logic devices are in an important field for performing various operations and in a key field that leads semiconductor markets with memory devices.

The most widely used logic circuits in electronic equipment are complementary transistor logic circuits based on Metal Oxide Semiconductor Field Effect Transistor (MOSFET). This type has advantages of fast switching speed and low power consumption.

Recently, factors of semiconductor devices that draw great attention are a reduction in size and multi-function. The two factors are linked with each other, and since the current silicon-based complementary transistor technology reaches the physical limits on a reduction in size, new devices and circuits capable of performing various functions are necessary.

SUMMARY

The present disclosure is directed to providing a complementary logic device having not only characteristics of low power and high speed but also characteristics of non-volatility and multiple switching by spin.

In one aspect, there is provided a complementary logic device including: an insulating layer formed on a substrate; a source electrode formed of a ferromagnetic body on the insulating layer; a gate insulating film formed on the source electrode; a gate electrode which is formed of a ferromagnetic body on the gate insulating film and controls a magnetization direction of the source electrode; a channel layer which is formed on each of a first side surface and a second side surface of the source electrode and transmits spin-polarized electrons from the source electrode; a first drain electrode formed of a ferromagnetic body on the first side surface of the source electrode with the channel layer interposed therebetween; and a second drain electrode formed of a ferromagnetic body on the second side surface of the source electrode with the channel layer interposed therebetween, wherein a magnetization direction of the first drain electrode and a magnetization direction of the second drain electrode are antiparallel to each other.

According to an embodiment, in a case where the magnetization direction of the first drain electrode is parallel to the magnetization direction of the source electrode, the magnetization direction of the second drain electrode may be antiparallel to the magnetization direction of the source electrode, and in a case where the magnetization direction of the first drain electrode is antiparallel to the magnetization direction of the source electrode, the magnetization direction of the second drain electrode may be parallel to the magnetization direction of the source electrode.

According to an embodiment, the magnetization direction of the source electrode may be changed according to a direction of a current flowing from the gate electrode to the source electrode.

According to an embodiment, the gate insulating film may be formed of an oxide film or a non-ferromagnetic body.

According to an embodiment, magnetic patterns of the gate electrode, the source electrode, the first drain electrode, and the second drain electrode may be made of ferromagnetic bodies including one of cobalt-iron (CoFe), cobalt (Co), nickel (Ni), nickel-iron (NiFe), and iron (Fe), or a combination thereof.

According to an embodiment, magnetic patterns of the gate electrode, the source electrode, the first drain electrode, and the second drain electrode may be made of magnetic semiconductors including one of gallium arsenide (GaAs), manganese arsenide (MnAs), and indium arsenide (InAs), a combination thereof.

According to an embodiment, the channel layer may be made of a metal, including one of gold (Au), platinum (Pt), silver (Ag), aluminum (Al), copper (Cu), and antimony (Sb), or a combination thereof, a semi-metal, or a semiconductor.

According to an embodiment, the channel layer may be made of graphene or nanowires.

According to an embodiment, the channel layer may be a two-dimensional electron gas structure.

According to an embodiment, the two-dimensional electron gas structure may include one of gallium arsenide (GaAs), indium arsenide (InAs), indium gallium arsenide (InGaAs), and indium antimonide (InSb), or a combination thereof.

According to an embodiment, the channel layer may include one of gallium arsenide (GaAs), indium arsenide (InAs), indium gallium arsenide (InGaAs), and indium antimonide (InSb) doped with an n-type semiconductor, or a combination thereof, and may be bonded to the ferromagnetic body through Ohmic contact or Schottky contact.

According to an embodiment, the insulating layer may include one of silicon dioxide ($SiO_2$), aluminum oxide ($Al_2O_3$), tantalum oxide ($TaO_x$), and magnesium oxide (MgO), or a combination thereof.

According to an embodiment, the complementary logic device may perform one of logic functions of an inverter, OR, AND, NOT, NOR, and NAND, or may perform an operation of a combination of two or more of the logic functions.

According to the complementary logic device using spin injection as described above, a complementary logic circuit may be implemented using spin injection. A complementary logic circuit according to the related art uses n-type and p-type semiconductors. On the other hand, according to the disclosure, the concept of parallelism and antiparallelism based on spin-up and spin-down is introduced, and thus two transistors may be controlled by a single gate electrode.

That is, the complementary logic device according to the disclosure may implement a complementary logic circuit by two fauns of transistors in the case where the magnetization directions of the source electrode and the drain electrode are parallel and in the case where the magnetization directions are antiparallel using the gate electrode and the source electrode which are common to the two forms of transistors. Therefore, not only characteristics of low power and high speed which are provided in the silicon-based complementary semiconductor transistor according to the related art, but also characteristics of non-volatility and multiple switching which are provided in the ferromagnetic body may be used.

Such a spin-based logic device may be used in a function conversion-type logic circuit, and may be applied to a device of a combination of logic and memory devices due to its memory characteristics.

BRIEF DESCRIPTION OF THE DRAWINGS

The above and other aspects, features and advantages of the disclosed exemplary embodiments will be more apparent from the following detailed description taken in conjunction with the accompanying drawings in which.

DETAILED DESCRIPTION OF MAIN ELEMENTS

| 100: complementary transistor | 101: substrate |
| 102: channel layer | 103: first drain electrode |
| 104: second drain electrode | 105: source electrode |
| 106: gate insulating film | 107: gate electrode |
| 108: insulating film | |

DETAILED DESCRIPTION

Hereinafter, exemplary embodiments of a complementary logic device using spin injection of the disclosure will be described in detail with reference to the drawings.

Figure 1:
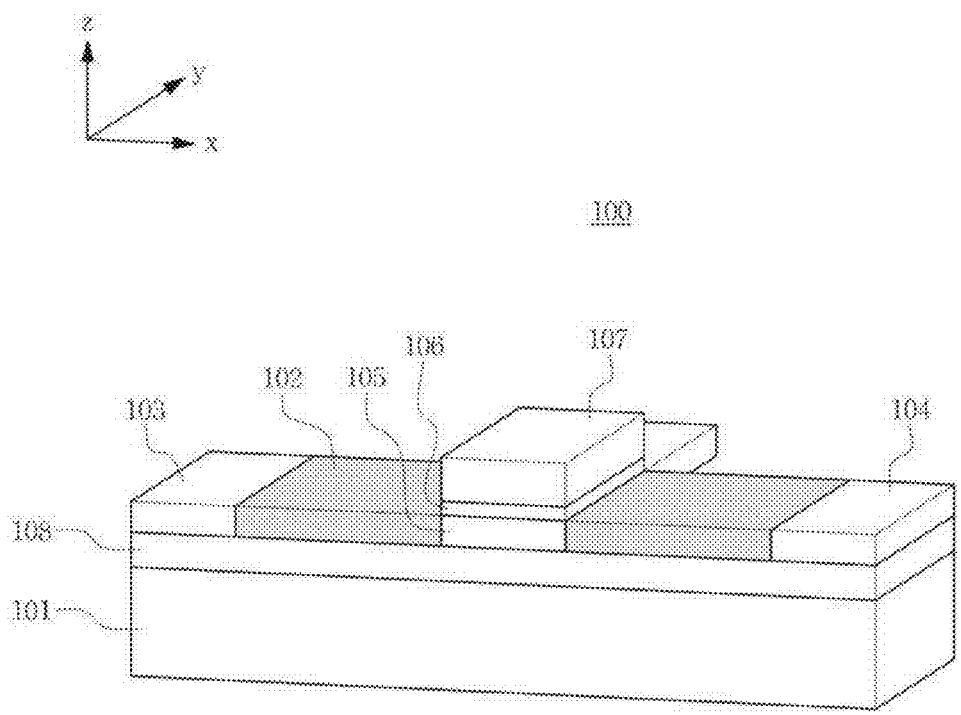
FIG. 1 is a perspective view of a complementary transistor according to an embodiment of the disclosure.

FIG. 1 is a perspective view of a complementary transistor according to an embodiment of the disclosure.

Referring to FIG. 1, the complementary transistor 100 using spin injection according to the embodiment of the disclosure includes a substrate 101, an insulating layer 108, a channel layer 102, a first drain electrode 103, a second drain electrode 104, a source electrode 105, a gate insulating film 106 and a gate electrode 107.

The substrate 101 may be an n-type or p-type semiconductor substrate and may be monocrystalline or polycrystalline.

The insulating layer 108 is formed on one surface of the substrate 101. The insulating layer 108 insulates the substrate 101 from the channel layer 102, the first drain electrode 103, the second drain electrode 104, the source electrode 105, and the gate electrode 107, which are formed on the insulating layer 108.

The insulating layer 108 may be made of one of silicon dioxide ($SiO_2$), aluminum oxide ($Al_2O_3$), tantalum oxide ($TaO_x$), and magnesium oxide (MgO), or a combination thereof.

The channel layer 102 is formed on the insulating layer 108 with the source electrode 105 interposed therebetween, and transmits spin-polarized electrons from the source electrode 105 to the first drain electrode 103 and the second drain electrode 104.

The channel layer 102 may be made of a semiconductor, a metal, or a semi-metal, and in a case of being made of a metal, for example, may include one of gold (Au), platinum (Pt), silver (Ag), aluminum (Al), copper (Cu), and antimony (Sb), a combination thereof. In addition, the channel layer 102 may be made of graphene or nanowires.

The first drain electrode 103 and the second drain electrode 104 are formed on both side surfaces of the source electrode 105 with the channel 102 interposed therebetween. The first drain electrode 103 forms a first transistor, and the second drain electrode 104 forms a second transistor.

That is, The first drain electrode 103 is formed on the first side surface of the source electrode 105, the second drain electrode 104 is formed on the second side surface of the source electrode 105, and spin-polarized electrons are transmitted from the source electrode 105 to the first drain electrode 103 and the second drain electrode 104 through the channel layer 102.

The first drain electrode 103 and the second drain electrode 104 may be formed of ferromagnetic bodies, and for example, may include one of cobalt-iron (CoFe), cobalt (Co), nickel (Ni), nickel-iron (NiFe), and iron (Fe), or a combination thereof. Otherwise, the first drain electrode 103 and the second drain electrode 104 may be formed of magnetic semiconductors, and may include one of gallium arsenide (GaAs), manganese arsenide (MnAs), and indium arsenide (InAs), or a combination thereof.

The first drain electrode 103 and the second drain electrode 104 have different magnetization directions, that is, antiparallel magnetization directions. For example, if the magnetization direction of the first drain electrode 103 is the +x direction, the magnetization direction of the second drain electrode 104 is the −x direction. If the magnetization direction of the first drain electrode 103 is the −x direction, the magnetization direction of the second drain electrode 104 is the +x direction.

The magnetization direction of one of the first drain electrode 103 and the second drain electrode 104 is parallel to the magnetization direction of the source electrode 105, and the magnetization direction of the other one thereof is antiparallel to the magnetization direction of the source electrode 105.

For example, in a case where the magnetization direction of the first drain electrode 103 is parallel to the magnetization direction of the source electrode 105, the magnetization direction of the second drain electrode 104 is antiparallel to the magnetization direction of the source direction 105. In a case where the magnetization direction of the first drain electrode 103 is antiparallel to the magnetization direction of the source electrode 105, the magnetization direction of the second drain electrode 104 is parallel to the magnetization direction of the source electrode 105.

The source electrode 105 is formed between the first drain electrode 103 and the second drain electrode 104 and is common to the first transistor and the second transistor in use. The magnetization direction of the source electrode 105 changes with the direction of a current flowing from the gate electrode 107 to the source electrode 105.

The source electrode 105 may be formed of a ferromagnetic body, and for example, may include one of cobalt-iron (CoFe), cobalt (Co), nickel (Ni), nickel-iron (NiFe), and iron (Fe), or a combination thereof. Otherwise, the source electrode 105 may be formed of a magnetic semiconductor, and may include one of gallium arsenide (GaAs), manganese arsenide (MnAs), and indium arsenide (InAs), or a combination thereof.

The gate electrode 107 is formed on the source electrode 105 to control the magnetization direction of the source electrode 105. The gate electrode 107 has a constant magnetization direction and is common to the first transistor and the second transistor in use.

The gate electrode 107 may also be formed of a ferromagnetic body, and for example, may include one of cobalt-iron (CoFe), cobalt (Co), nickel (Ni), nickel-iron (NiFe), and iron (Fe), or a combination thereof. Otherwise, the gate electrode 107 may be formed of a magnetic semiconductor, and may include one of gallium arsenide (GaAs), manganese arsenide (MnAs), and indium arsenide (InAs), or a combination thereof.

The magnetization directions of the source electrode 105 and the gate electrode 107 may be independently determined by the gate insulating film 106. The gate insulating film 106 may be formed of an oxide film or a non-ferromagnetic body.

In summary, the first drain electrode 103, the source electrode 105, and the gate electrode 107 form the first transistor, and the second drain electrode 104, the source electrode 105, and the gate electrode 107 form the second transistor. Here, the source electrode 105, the gate electrode 107, and the gate insulating film 106 are common to the first transistor and the second transistor in use.

Since the first drain electrode 103 and the second drain electrode 104 have antiparallel magnetization directions, one of the first transistor and the second transistor is a spin transistor in which the magnetization directions the source electrode and the drain electrode are parallel to each other, and the other one thereof is a spin transistor in which the magnetization directions the source electrode and the drain electrode are antiparallel to each other.

During manufacture, the complementary transistor 100 may be designated so that the gate electrode 107 always has a constant magnetization direction during operation and the first drain electrode 103 and the second drain electrode 104 have antiparallel magnetization direction during operation.

Figure 2A:
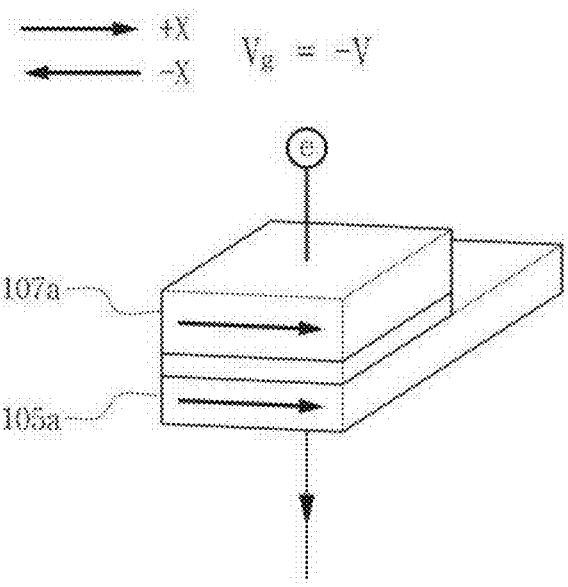
FIGS. 2A and 2B are conceptual diagrams showing a method of switching the magnetization direction of a source electrode of FIG. 1 using a gate electrode.
Figure 2B:
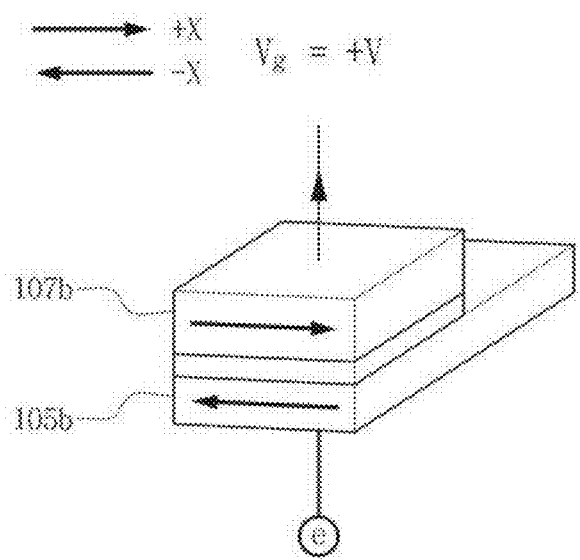

FIGS. 2A and 2B are conceptual diagrams showing a method of switching the magnetization direction of the source electrode of FIG. 1 using the gate electrode.

Here, both of the gate electrode 107a and 107b and the source electrode 105a and 105b are made of ferromagnetic bodies, and the gate electrode 107a and 107b uses a material having a higher switching current than the source electrode 105a and 105b.

It is assumed that the magnetization direction of the gate electrode 107a and 107b is the +x direction. In this case, the magnetization direction of the source electrode 105a and 105b is determined according to the voltage of the gate electrode 107a and 107b. Each of the magnetization direction is as shown by the arrow direction displayed in the source electrode 105a and 105b and the gate electrode 107a and 107b.

As illustrated in FIG. 2A, when a gate voltage Vg has a negative (−) sign, electrons (e) flow from the gate electrode 107a to the source electrode 105a. Therefore, spin torque having the same direction as the magnetization direction of the gate electrode 107a is transmitted, and thus the magnetization direction of the source electrode 105a becomes the same as the magnetization direction of the gate electrode 107a.

On the other hand, as illustrated in FIG. 2B, when the gate voltage Vg has a positive (+) sign, electrons (e) flow from the source electrode 105b to the gate electrode 107b. Therefore, only spin having the same direction as the magnetization direction of the gate electrode 107a is reflected by the gate electrode 107b, and thus the source electrode 105b is changed to a direction antiparallel to the magnetization direction of the gate electrode 107b.

In order words, the magnetization direction of the source electrode 105a and 105b may be controlled according to the voltage Vg of the gate electrode 107a and 107b. The switching principle as described above is caused by spin torque transfer.

Figure 3A:
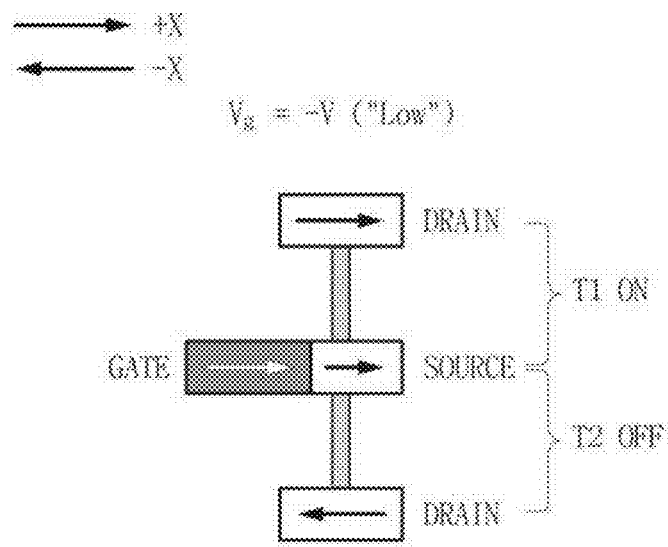
FIGS. 3A and 3B are conceptual diagrams of the complementary transistor in cases where a gate voltage of FIG. 1 is "Low" and "High"
Figure 3B:
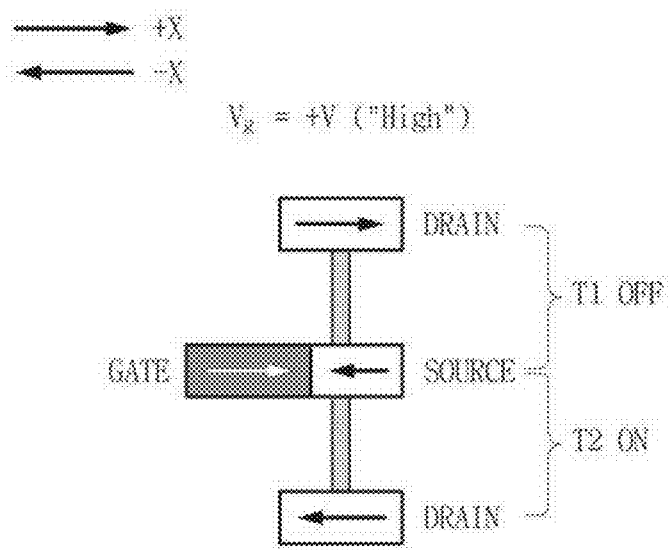

FIGS. 3A and 3B are conceptual diagrams of the complementary transistor in cases where the gate voltage of FIG. 1 is "Low" and "High".

FIGS. 3A and 3B show the principle of operating the complementary transistor. As described with reference to FIGS. 2A and 2B, the magnetization direction of the source electrode is determined by the sign of the gate voltage (Vg). In addition, the magnetization directions of the first drain electrode and the second drain electrode of the two transistors T1 and T2 are arranged to be antiparallel to each other.

First, as illustrated in FIG. 3A, in the case where the gate voltage Vg has the negative sign ("Low"), the magnetization direction of the source electrode becomes parallel to the magnetization direction of the drain electrode of the first transistor T1 and becomes antiparallel to the magnetization direction of the drain electrode of the second transistor T2.

In this case, the first transistor T1 having the drain electrode with the parallel magnetization direction is turned on (ON), and the second transistor T2 having the drain electrode with the antiparallel magnetization direction is turned off (OFF).

On the other hand, as illustrated in FIG. 3B, in the case where the gate voltage Vg has the positive sign ("High"), the magnetization direction of the source electrode becomes parallel to the magnetization direction of the drain electrode of the second transistor T2 and becomes antiparallel to the magnetization direction of the drain electrode of the first transistor T1.

In this case, the second transistor T2 having the drain electrode with the parallel magnetization direction is turned on (ON), and the first transistor T1 having the drain electrode with the antiparallel magnetization direction is turned off (OFF).

In this manner, one transistor is turned on (ON) and the other transistor is turned off (OFF) according to the gate electrode, thereby implementing a complementary transistor.

Figure 4:
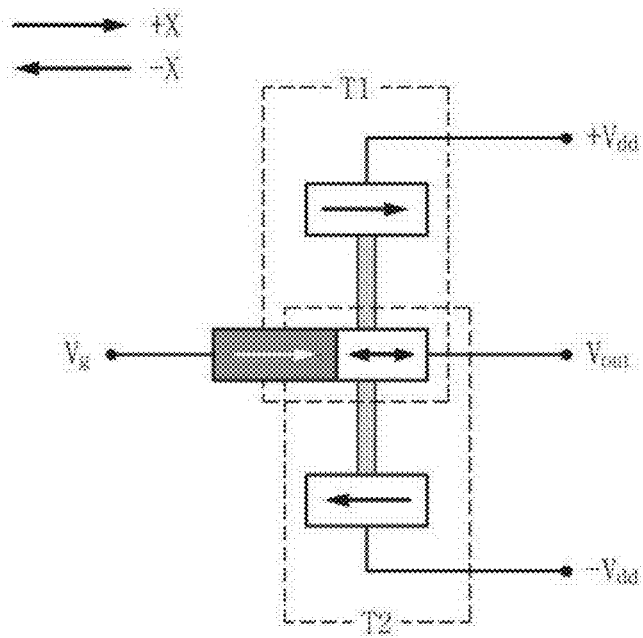
FIG. 4 is a conceptual diagram of an inverter implemented using the complementary transistor of FIG. 1.

FIG. 4 is a conceptual diagram of an inverter implemented using the complementary transistor of FIG. 1.

FIG. 4 is an example of configuring a complementary transistor logic circuit using two forms of transistors T1 and T2 for application to an inverter. The first transistor T1 configured with the drain electrode of which the magnetization direction is the +x direction is positioned in the upper portion, and the second transistor T2 configured with the drain electrode of which the magnetization direction is the −x direction is positioned in the lower portion.

As described above, in the case where the gate voltage Vg have the negative value ("Low"), the first transistor T1 is turned on (ON), and the second transistor T2 is turned off (OFF). In this case, an output voltage Vout is connected to +Vdd and enters a "High" state.

On the other hand, in the case where the gate voltage Vg have the positive value ("High"), the second transistor T2 is turned on (ON), and the first transistor T1 is turned off (OFF). In this case, the output voltage Vout is connected to −Vdd and enters a "Low" state.

In this manner, a signal that is always opposite to the gate voltage Vg is detected by the output end, and thus the function of the inverter is achieved. Here, the gate voltage Vg is changed according to the channel layer or the gate insulating film and may typically be about +1 V or about −1 V.

In this embodiment, the inverter using the complementary transistor according to the disclosure is described. However, besides the inverter, a circuit that performs one of logic functions of OR, AND, NOT, NOR, and NAND may be configured or a logic circuit that performs an operation of a combination of two or more of the logic functions may be designed using the complementary transistor.

Figure 5:
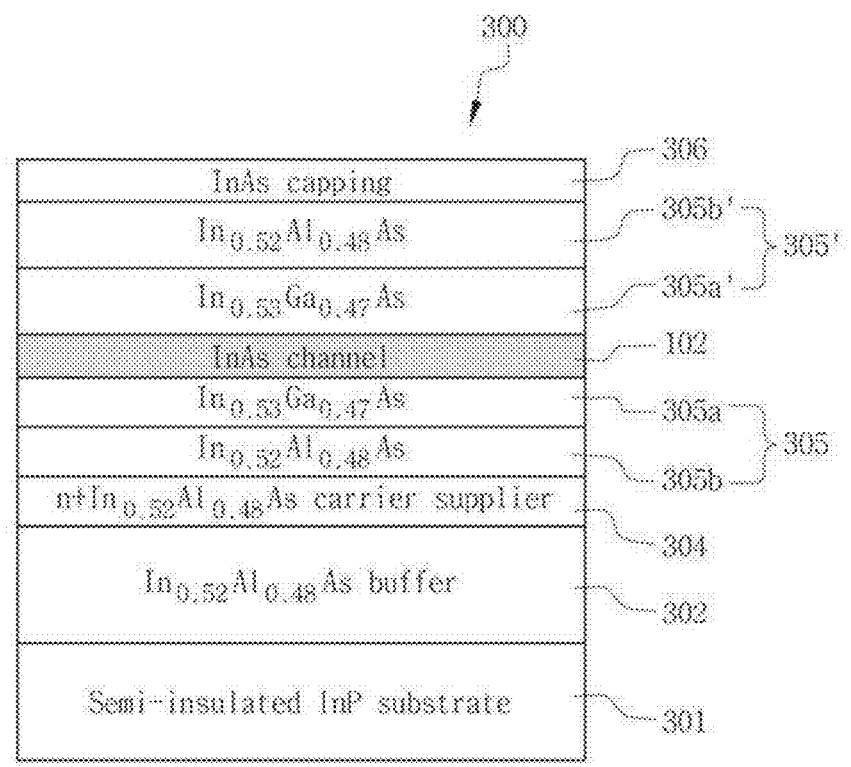
FIG. 5 is a cross-sectional view of the channel structure of a complementary transistor according to another embodiment of the disclosure.

FIG. 5 is a cross-sectional view of the channel structure of a complementary transistor according to another embodiment of the disclosure.

The channel structure of the complementary transistor according to another embodiment of the disclosure has a two-dimensional electron gas structure. The channel structure 300 of the complementary transistor according to this embodiment includes an InAlAs buffer layer 302, an n-doped InAlAs charge supply layer 304, an InGaAs/InAlAs lower cladding layer 305, an InAs channel layer 102, an InAlAs/InGaAs upper cladding layer 305', and an InAs capping layer 306, which are sequentially stacked on a semi-insulated InP substrate 301.

Each of the upper and lower cladding layers 305 and 305' has a double cladding structure including an InGaAs layer and an InAlAs layer. That is, the lower cladding layer 305 includes a first lower cladding layer 305a made of InGaAs and a second lower cladding layer 305b which is formed thereunder and is made of InAlAs. In addition, the upper cladding layer 305' includes a first upper cladding layer 305a' made of InGaAs and a second upper cladding layer 305b' which is formed thereover and is made of InAlAs.

The second lower cladding layer 305b has a higher energy band gap than the first lower cladding layer 305a, and the second upper cladding layer 305b' has a higher energy band gap than the first upper cladding layer 305a', achieving a role of doubly trapping electrons.

The channel layer 102 forms a quantum well by the energy barrier of the upper and lower cladding layers 305 and 305'. Particularly, electrons are trapped in the channel layer 102 by the upper and lower cladding layers 305 and 305' having the double cladding structure, and the channel layer 102 forms a two-dimensional electron gas (2-DEG) layer.

The channel layer 102 may include one of gallium arsenide (GaAs), indium arsenide (InAs), indium gallium arsenide (InGaAs), and indium antimonide (InSb) doped with an n-type semiconductor, or a combination thereof, and may be bonded to the source electrode or the drain electrode made of a ferromagnetic body through Ohmic contact or Schottky contact.

The two-dimensional electron gas layer has very high electron mobility and also has a high spin-orbit coupling effect.

In this embodiment, InAs is used as the channel layer 102, but the disclosure is not limited thereto. For example, GaAs, InGaAs, or InSb may be used as the channel layer having the two-dimensional electron gas structure.

The n-doped InAlAs charge supply layer 304 is formed below the channel layer 102 to supply charges to the channel layer 102, and the InAlAs buffer layer 302 reduces lattice mismatch between the InP substrate 301 and the lower cladding layer 305.

In addition, the InAs capping layer 306 at the top of the semiconductor substrate unit 300 has a role of preventing oxidation and modification of the semiconductor substrate unit 300 that may occur during processes and prevents oxidation and modification that may occur during processes of various layers thereunder.

According to the disclosure, using the spin injection, the complementary logic device may be implemented by the two forms of transistors in the case where the magnetization directions of the source electrode and the drain electrode are parallel and in the case where the magnetization directions are antiparallel using the gate electrode and the source electrode which are common to the two forms of transistors. Therefore, not only characteristics of low power and high speed but also characteristics of non-volatility and multiple switching by spin may be obtained.

In addition, a complementary transistor logic device capable of being used in a multi-functional logic circuit and of performing a memory function may be implemented.

While the exemplary embodiments have been shown and described, it will be understood by those skilled in the art that various changes in form and details may be made thereto without departing from the spirit and scope of the present disclosure as defined by the appended claims.

What is claimed is:

1. A complementary logic device comprising:
an insulating layer formed on a substrate;
a source electrode formed of a ferromagnetic body on the insulating layer;
a gate insulating film formed on the source electrode;
a gate electrode which is formed of a ferromagnetic body on the gate insulating film and controls a magnetization direction of the source electrode;
a channel layer which is formed on each of a first side surface and a second side surface of the source electrode and transmits spin-polarized electrons from the source electrode;
a first drain electrode formed of a ferromagnetic body on the first side surface of the source electrode with the channel layer interposed therebetween; and
a second drain electrode formed of a ferromagnetic body on the second side surface of the source electrode with the channel layer interposed therebetween,
wherein a magnetization direction of the first drain electrode and a magnetization direction of the second drain electrode are antiparallel to each other.

2. The complementary logic device according to claim 1, wherein, in a case where the magnetization direction of the first drain electrode is parallel to the magnetization direction of the source electrode, the magnetization direction of the second drain electrode is antiparallel to the magnetization direction of the source electrode, and in a case where the magnetization direction of the first drain electrode is antiparallel to the magnetization direction of the source electrode, the magnetization direction of the second drain electrode is parallel to the magnetization direction of the source electrode.

3. The complementary logic device according to claim 1, wherein the magnetization direction of the source electrode is changed according to a direction of a current flowing from the gate electrode to the source electrode.

4. The complementary logic device according to claim 1, wherein the gate insulating film is formed of an oxide film or a non-ferromagnetic body.

5. The complementary logic device according to claim 1, wherein magnetic patterns of the gate electrode, the source electrode, the first drain electrode, and the second drain electrode are made of ferromagnetic bodies including one of cobalt-iron (CoFe), cobalt (Co), nickel (Ni), nickel-iron (NiFe), and iron (Fe), or a combination thereof.

6. The complementary logic device according to claim 1, wherein magnetic patterns of the gate electrode, the source electrode, the first drain electrode, and the second drain electrode are made of magnetic semiconductors including one of gallium arsenide (GaAs), manganese arsenide (MnAs), and indium arsenide (InAs), or a combination thereof.

7. The complementary logic device according to claim 1, wherein the channel layer is made of a metal including one of gold (Au), platinum (Pt), silver (Ag), aluminum (Al), copper (Cu), and antimony (Sb), or a combination thereof, a semi-metal, or a semiconductor.

8. The complementary logic device according to claim 1, wherein the channel layer is made of graphene or nanowires.

9. The complementary logic device according to claim 1, wherein the channel layer is a two-dimensional electron gas structure.

10. The complementary logic device according to claim 9, wherein the two-dimensional electron gas structure includes one of gallium arsenide (GaAs), indium arsenide (InAs), indium gallium arsenide (InGaAs), and indium antimonide (InSb), or a combination thereof.

11. The complementary logic device according to claim 1, wherein the channel layer includes one of gallium arsenide (GaAs), indium arsenide (InAs), indium gallium arsenide (InGaAs), and indium antimonide (InSb) doped with an n-type semiconductor, or a combination thereof, and is bonded to the ferromagnetic body through Ohmic contact or Schottky contact.

12. The complementary logic device according to claim 1, wherein the insulating layer includes one of silicon dioxide ($SiO_2$), aluminum oxide ($Al_2O_3$), tantalum oxide ($TaO_x$), and magnesium oxide (MgO), or a combination thereof.

13. The complementary logic device according to claim 1, which performs one of logic functions of an inverter, OR, AND, NOT, NOR, and NAND, or performs an operation of a combination of two or more of the logic functions.

* * * * *